United States Patent
Fukatsu et al.

(10) Patent No.: US 12,477,809 B2
(45) Date of Patent: Nov. 18, 2025

(54) SEMICONDUCTOR DEVICE AND METHOD FOR MANUFACTURING SEMICONDUCTOR DEVICE

(71) Applicant: KABUSHIKI KAISHA TOSHIBA, Tokyo (JP)

(72) Inventors: Shigeto Fukatsu, Yokohama (JP); Yukio Nakabayashi, Yokohama (JP); Tatsuo Shimizu, Shinagawa (JP); Ryosuke Iijima, Setagaya (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 629 days.

(21) Appl. No.: 17/816,772

(22) Filed: Aug. 2, 2022

(65) Prior Publication Data

US 2023/0064865 A1 Mar. 2, 2023

(30) Foreign Application Priority Data

Sep. 1, 2021 (JP) .................................. 2021-142391
May 25, 2022 (JP) .................................. 2022-085001

(51) Int. Cl.
*H10D 64/68* (2025.01)
*H01L 21/04* (2006.01)
(Continued)

(52) U.S. Cl.
CPC ......... *H10D 64/685* (2025.01); *H01L 21/049* (2013.01); *H10D 62/8325* (2025.01);
(Continued)

(58) Field of Classification Search
CPC .......................... H01L 21/049; H10D 62/8325
See application file for complete search history.

(56) References Cited

U.S. PATENT DOCUMENTS 7,816,688 B2    10/2010    Yamashita et al.
2018/0330949 A1*   11/2018    Asaba ............... H01L 21/02271

FOREIGN PATENT DOCUMENTS

JP          2005-109396 A    4/2005
JP          WO 2003/047000    4/2005
(Continued)

OTHER PUBLICATIONS

Chung et al., "Interface State Density and Channel Mobility for 4H-SiC MOSFETs with Nitrogen Passivation", Applied Surface Science 184, 2001, 6 pages.

*Primary Examiner* — Zandra V Smith
*Assistant Examiner* — Molly K Reida
(74) *Attorney, Agent, or Firm* — Oblon, McClelland, Maier & Neustadt, L.L.P.

(57) ABSTRACT

According to one embodiment, a method for manufacturing a semiconductor device is disclosed. The method can include preparing a structure body, the structure body including a silicon carbide member and a first film stacked with the silicon carbide member. The first film includes silicon and oxygen. The method can include performing a first treatment of heat-treating the structure body in a first atmosphere including hydrogen. The method can include, after the first treatment, performing a second treatment of heat-treating the structure body in a second atmosphere including nitrogen and oxygen. An oxygen concentration in the second atmosphere is not less than 5 ppm and not more than 1000 ppm.

9 Claims, 12 Drawing Sheets

(51) Int. Cl.
*H10D 62/832* (2025.01)
*H10D 12/01* (2025.01)
*H10D 30/66* (2025.01)

(52) U.S. Cl.
CPC ......... *H10D 64/693* (2025.01); *H10D 12/031* (2025.01); *H10D 30/66* (2025.01)

(56) References Cited

FOREIGN PATENT DOCUMENTS

| | | |
|---|---|---|
| JP | 2007-201343 A | 8/2007 |
| JP | 4647211 B2 | 3/2011 |
| JP | 2014-103175 A | 6/2014 |

\* cited by examiner

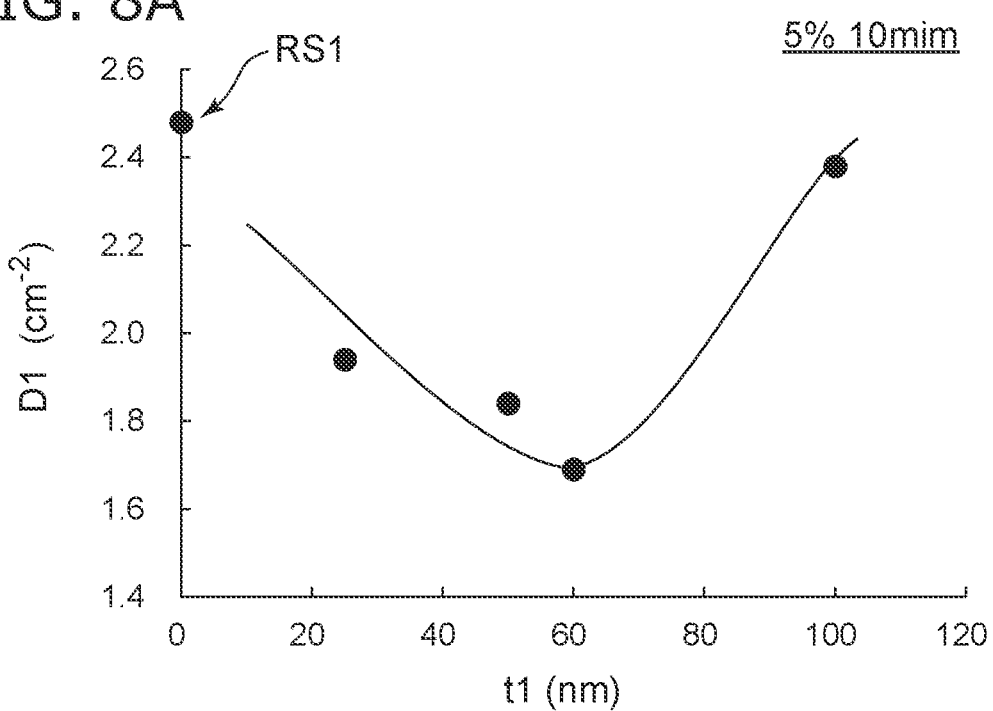
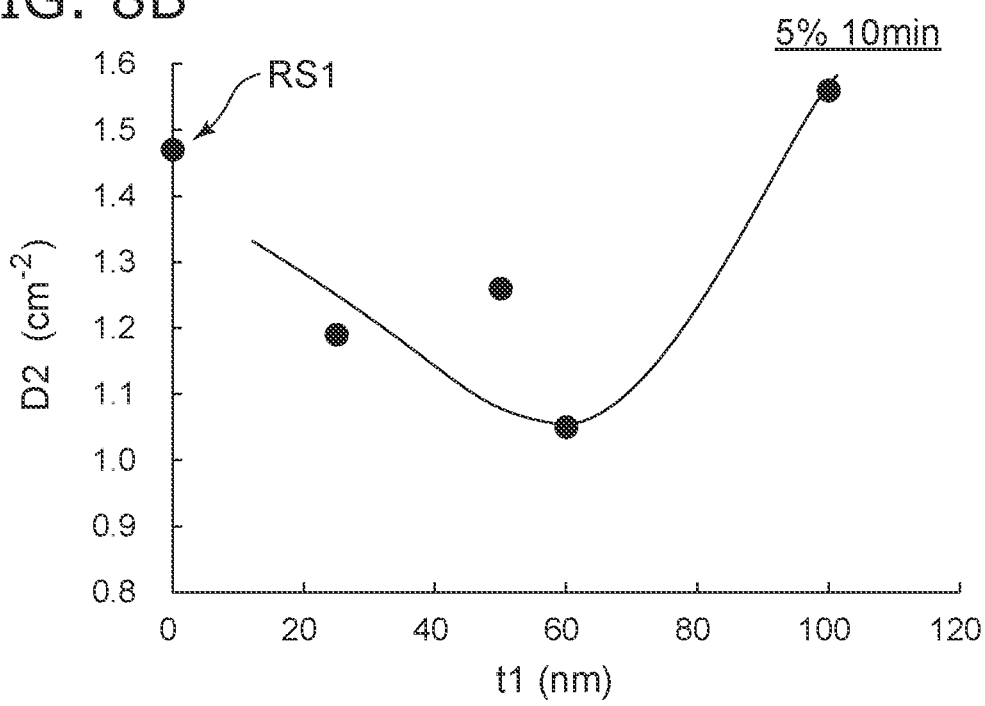

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2021-142391, filed on Sep. 1, 2021, and Japanese Patent Application No. 2022-085001, filed on May 25, 2022; the entire contents of which are incorporated herein by reference.

FIELD

Embodiments described herein relate generally to semiconductor device and a method for manufacturing a semiconductor device.

BACKGROUND

There are semiconductor devices such as transistors using silicon carbide (SiC). Good characteristics are required in semiconductor devices.

BRIEF DESCRIPTION OF THE DRAWINGS

FIGS. 8A and 8B are graphs illustrating characteristics in the semiconductor device;

DETAILED DESCRIPTION

Figure 1:
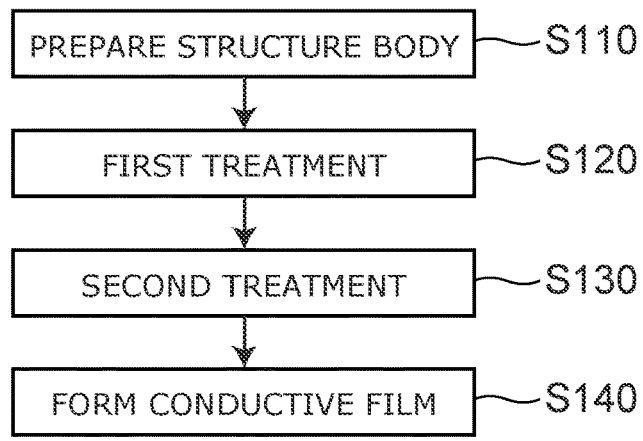
FIG. 1 is a flowchart illustrating a method for manufacturing a semiconductor device according to an embodiment.

According to one embodiment, a method for manufacturing a semiconductor device is disclosed. The method can include preparing a structure body, the structure body including a silicon carbide member and a first film stacked with the silicon carbide member. The first film includes silicon and oxygen. The method can include performing a first treatment of heat-treating the structure body in a first atmosphere including hydrogen. The method can include, after the first treatment, performing a second treatment of heat-treating the structure body in a second atmosphere including nitrogen and oxygen. An oxygen concentration in the second atmosphere is not less than 5 ppm and not more than 1000 ppm.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

FIG. 1 is a flowchart illustrating a method for manufacturing a semiconductor device according to an embodiment.

Figure 2:
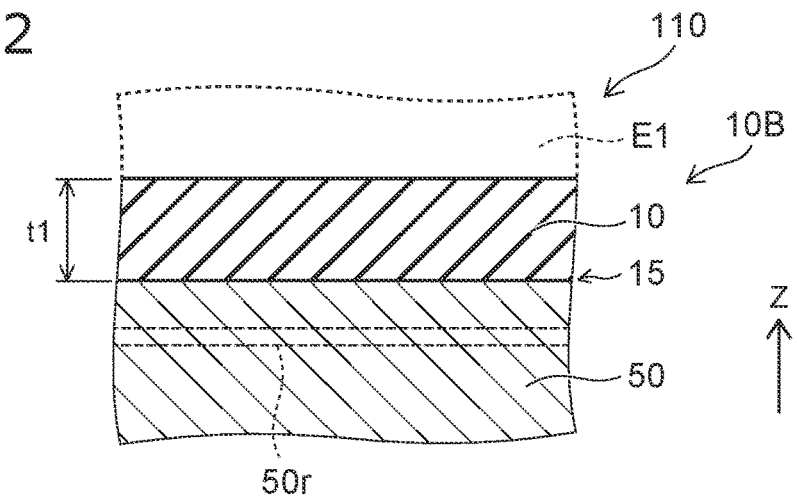
FIG. 2 is a schematic cross-sectional view illustrating the semiconductor device according to the embodiment.

FIG. 2 is a schematic cross-sectional view illustrating the semiconductor device according to the embodiment.

As shown in FIG. 1, a method for manufacturing a semiconductor device according to an embodiment includes preparing a structure body (step S110), a first treatment (step S120), and a second treatment (step S130). The manufacturing method may include the formation of a conductive film (step S140) described later.

As shown in FIG. 2, in the semiconductor device 110, the first film 10 is provided on the silicon carbide member 50. The structure body 10B includes a silicon carbide member 50 and a first film 10. The first film 10 is stacked on the silicon carbide member 50. The silicon carbide member 50 includes silicon carbide (SiC). The silicon carbide member 50 includes, for example, 4H—SiC.

The first film 10 includes silicon and oxygen. The first film 10 is, for example, a silicon oxide film. For example, the first film 10 is deposited on the silicon carbide member 50. The first film 10 is formed, for example, by chemical vapor deposition (CVD). The chemical vapor deposition may include atomic layer deposition (ALD). The first film 10 may be formed by, for example, a PVD (physical vapor deposition) method. The PVD method includes at least one of vapor deposition and sputtering. The method for manufacturing the semiconductor device according to the embodiment may further include depositing the first film 10 on the silicon carbide member 50 (one example of step S110).

A direction from the silicon carbide member 50 toward the first film 10 is a Z-axis direction. For example, the first film 10 is in contact with the silicon carbide member 50. An interface 15 exists between the silicon carbide member 50 and the first film 10.

A thickness t1 of the first film 10 (thickness before the first treatment) is, for example, not less than 20 nm and not more than 100 nm. The thickness t1 is a length along the Z-axis direction. The first film 10 having such a thickness t1 can be used as a gate insulating film of a transistor. With such a thickness t1, appropriate insulation, appropriate electrical characteristics (e.g., threshold voltage, etc.), and good reliability can be obtained. The thickness t1 may be not less than 30 nm and not more than 60 nm.

In the semiconductor device 110, a first conductive film E1 may be further provided. The first conductive film E1 is, for example, a gate electrode. The first treatment and the second treatment described above are performed before forming the first conductive film E1. The semiconductor device 110 includes a structure body 10B and the first conductive film E1. The semiconductor device 110 is, for example, a transistor.

In the first treatment (step S120), the structure body 10B is heat-treated in a first atmosphere including hydrogen.

The second treatment (step S130) is performed after the first treatment. In the second treatment, the structure body 10B is heat-treated in a second atmosphere including nitrogen ($N_2$) and oxygen ($O_2$). The second atmosphere includes trace amounts of oxygen. For example, a concentration of oxygen ($O_2$) in the second atmosphere is not less than 5 ppm and not more than 1000 ppm. This concentration is a volume ratio.

By such treatment, high carrier mobility can be obtained in the semiconductor device 110.

Figure 3:
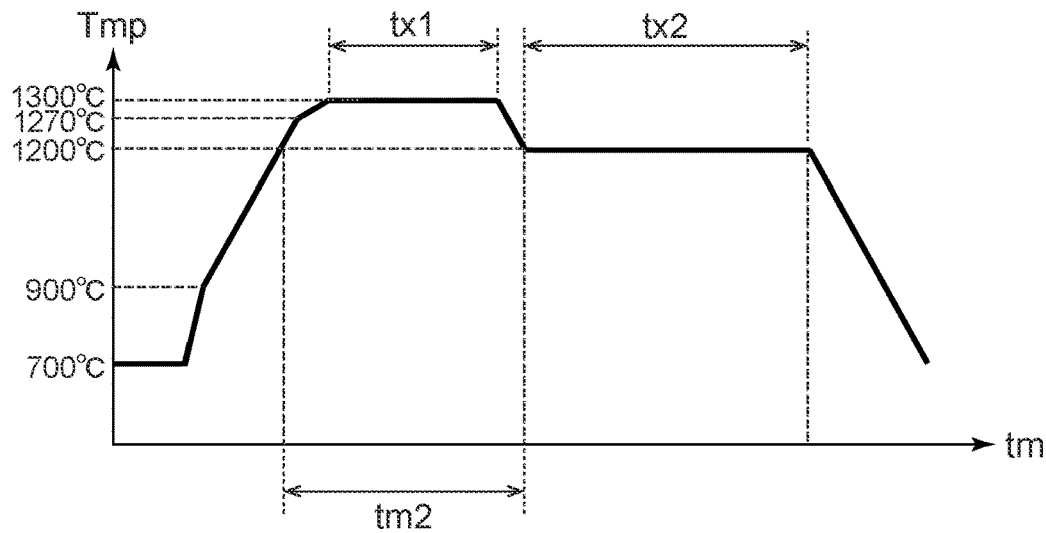
FIG. 3 is a schematic diagram illustrating the method for manufacturing a semiconductor device according to an embodiment.

FIG. 3 is a schematic diagram illustrating the method for manufacturing the semiconductor device according to the embodiment.

FIG. 3 illustrates a change in temperature in the second treatment. The horizontal axis of FIG. 3 is time tm. The vertical axis is the temperature Tmp.

As shown in FIG. 3, in the second treatment, the temperature of the structure body 10B rises from 700° C. to 1300° C., then is maintained at 1200° C., and then drops to 700° C. or lower. As shown in FIG. 3, the maintenance time at 1300° C. (maximum temperature) is defined as time tx1. The maintenance time at 1200° C. is defined as time tx2. In one example (first sample), the time tx1 is 3 hours. The time tx2 is 5.5 hours. The second atmosphere includes nitrogen ($N_2$) and oxygen ($O_2$). The oxygen concentration (volume ratio) in the second atmosphere is 500 ppm. Further, a sample of the first reference example is prepared in which the second atmosphere is nitrogen and substantially includes no oxygen (concentration is less than 0.1 ppm).

The carrier mobility in the first sample is lower than the carrier mobility in the sample of the first reference example. Higher carrier mobility can be obtained in a sample including a small amount of oxygen than in a sample including no oxygen. According to the embodiment, it is possible to provide a method for manufacturing a semiconductor device whose characteristics can be improved.

High carrier mobility can be obtained in a sample in an atmosphere including a small amount of oxygen is considered to relate to a good condition at the interface between the silicon carbide member 50 and the first film 10 by heat treatment in the second atmosphere including a small amount of oxygen and nitrogen.

For example, a low second interface state density and a high carrier mobility can be obtained by the second treatment in the second atmosphere (atmosphere including the trace amount of oxygen and nitrogen). It is considered that this is because the silicon atom is effectively terminated with nitrogen at the interface 15 between the silicon carbide member 50 and the first film 10. On the other hand, a small amount of oxygen repairs the oxygen deficiency in the first film 10 (silicon oxide film). Thus, in the second treatment, the nitrogen termination of the interface 15 and the film quality of the first film 10 are improved. This results in a low interface state density. As a result, high carrier mobility can be obtained.

In the embodiment, the temperature in the second treatment is preferably not less than 1200° C. and not more than 1300° C. By such a temperature, the interface state density can be suppressed and high carrier mobility can be obtained. According to the embodiment, it is possible to provide a method for manufacturing a semiconductor device whose characteristics can be improved.

The time exceeding 1200° C. (the time tm2 exemplified in FIG. 3) in the second treatment is preferably not less than 1 hour and not more than 10 hours. As a result, the interface state density can be reliably suppressed. High carrier mobility can be obtained more reliably.

In the embodiment, for example, the oxygen in the second atmosphere is $O_2$, and the nitrogen in the second atmosphere is $N_2$. In embodiments, it is preferred that the second atmosphere is substantially free of NO. For example, the concentration of NO in the second atmosphere is preferably less than 0.3 ppm. This concentration is a volume ratio.

By the second atmosphere being substantially free of NO, for example, silicon atoms are effectively terminated with nitrogen, and the film quality of the first film 10 is improved. That is, nitrogen in the second atmosphere acts on the interface 15, and oxygen in the second atmosphere acts on the first film 10. When the second atmosphere includes NO, nitrogen and oxygen atoms are present at the same time. Thereby, it is difficult to obtain the above effect.

The concentration of nitrogen (for example, $N_2$) included in the second atmosphere is preferably not less than 0.1% and less than 100%. The concentration of nitrogen (for example, $N_2$) included in the second atmosphere may be 99.9% or less. The interface state density can be reliably suppressed. High carrier mobility can be obtained more reliably. The above concentration is a volume ratio.

An example of the temperature profile in the second treatment is as shown in FIG. 1n one example, the rate of change in temperature increasing from 700° C. to 900° C. is, for example, about 10° C./min. The rate of change in temperature increasing from 900° C. to 1270° C. is, for example, about 5° C./min. The rate of change of the temperature increasing from 1270° C. to 1300° C. is, for example, about ° C./min. The rate of change in the temperature decreasing from 1300° C. to 1200° C. is, for example, about ° C./min.

In the embodiment, it is preferable that the first treatment is performed before the second treatment. The first treatment is a heat treatment in a first atmosphere including hydrogen.

For example, in a sample in which the second treatment was performed in an atmosphere including substantially no oxygen and including nitrogen after the first treatment, the interface state density was about $2.5 \times 10^{12}/cm^{-2}$. On the other hand, in the sample in which the second treatment in the second atmosphere including nitrogen and a trace amount of oxygen after the first treatment, the interface state density can be about $2.1 \times 10^{12}/cm^{-2}$ or less.

For example, the heat treatment in the first atmosphere including hydrogen removes carbon atoms and forms a silicon-rich silicon carbide region, for example, in a region including the interface 15 between the silicon carbide member 50 and the first film 10.

By forming the silicon-rich silicon carbide region in the region including the interface 15, nitrogen is easily bonded to silicon. Subsequent second treatment ensures that the nitrogen termination of the silicon is done. As a result, at the interface 15 between the silicon carbide member 50 and the first film 10, a connection region that satisfactorily connects the silicon carbide member 50 and the first film 10 is easily formed. In the connecting region, the silicon is terminated with nitrogen and a low interface state density is stably obtained. For example, the second treatment includes binding nitrogen to the silicon present in the region between the silicon carbide member 50 and the first film 10.

For example, unnecessary oxygen in the first film 10 is removed by the first treatment in the first atmosphere including hydrogen. Unnecessary oxygen can oxidize silicon carbide at high temperatures in the second treatment. Due to oxidation of silicon carbide, carbon atoms remain in the oxide film, which may make it difficult to obtain high properties (e.g., high carrier mobility). Therefore, it is preferable to suppress the oxidation of silicon carbide. By removing unnecessary oxygen in the first treatment, undesired oxidation of silicon carbide in the second treatment is suppressed.

The first treatment in the first atmosphere including hydrogen may cause oxygen deficiency in the first film 10. The second treatment in the second atmosphere including a trace amount of oxygen repairs the oxygen deficiency. As a result, high film quality can be obtained.

Oxygen deficiency is repaired by the second treatment in the atmosphere including nitrogen and a trace amount of oxygen. This improves the film quality. In the second treatment, the oxygen concentration is set low. This suppresses the oxidation of silicon carbide in the second treatment.

The concentration of hydrogen in the first atmosphere is not less than 0.01% and not more than 100%. The first atmosphere preferably does not include NO. The concentration of NO in the first atmosphere is, for example, 0.001 ppm or less. These concentrations are volume ratios.

When the first atmosphere of the first treatment includes oxygen, it becomes difficult to remove carbon of silicon carbide, and it becomes difficult to effectively terminate the silicon carbide. For example, the reduction of interface states tends to be insufficient. When the first atmosphere of the first treatment includes oxygen, it becomes difficult to remove unnecessary oxygen included in the first film 10. In this case, the silicon carbide is easily oxidized in the second treatment. It is difficult to obtain high characteristics (for example, high carrier mobility).

When the oxygen concentration in the second atmosphere of the second treatment exceeds 1000 ppm, the surface of silicon carbide tends to oxidize. It is difficult to obtain high characteristics (for example, high carrier mobility).

For example, there is a reference example in which the interface state is terminated with nitrogen by using oxynitriding in nitric oxide (NO) atmosphere or nitrous oxide in nitrous oxide ($N_2O$) atmosphere without performing the first treatment. In this reference example, an oxidation reaction occurs with the nitrogen termination. Therefore, the characteristics deteriorate due to the oxidation of silicon carbide.

On the other hand, in the embodiment, the oxidation of silicon carbide can be appropriately suppressed by using nitrogen and oxygen having an appropriate concentration. As a result, deterioration of the characteristics is suppressed.

In the embodiment, in the second treatment after the first treatment in the first atmosphere including hydrogen, the second atmosphere may include at least one of nitric oxide and nitrous oxide. The first treatment promotes nitrogen termination and suppresses oxidation. Higher carrier mobility can be easily obtained as compared with the above reference example in which the first treatment is not performed. When the second treatment in at least one of nitric oxide and nitrous oxide atmosphere is performed after the first treatment in the first atmosphere, the concentration of nitric oxide or the concentration of nitrous oxide may be set lower than that for the reference example.

Figure 4:
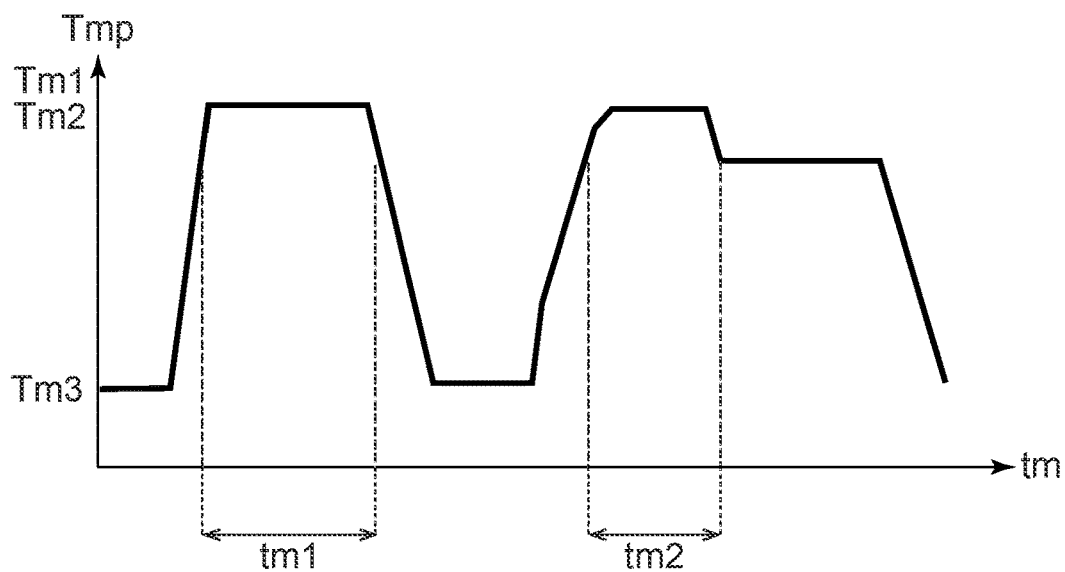
FIG. 4 is a schematic diagram illustrating the method for manufacturing a semiconductor device according to an embodiment.

FIG. 4 is a schematic diagram illustrating the method for manufacturing the semiconductor device according to the embodiment.

FIG. 4 illustrates changes in temperature in the first treatment and the second treatment. The horizontal axis of FIG. 4 is time tm. The vertical axis is the temperature Tmp.

For example, in the first treatment, the heat treatment is performed at the first temperature T1 in the first atmosphere including hydrogen. The first temperature T1 is, for example, not less than 1200° C. and not more than 1350° C. The time tm1 of the first treatment (time when the temperature Tmp exceeds 1200° C.) is preferably, for example, not less than 15 minutes and not more than 10 hours.

In the second treatment, the second treatment is performed by the second temperature T2 in the second atmosphere including a trace amount of oxygen and nitrogen. The time tm2 of the second treatment is preferably not less than 1 hour and not more than 20 hours.

As shown in FIG. 4, the structure body 10B may be set to a temperature lower than the first temperature T1 (third temperature T3) between the first treatment and the second treatment. The first treatment and the second treatment may be continuously performed by the same apparatus. The first treatment and the second treatment may be performed discontinuously by another apparatus. In the structure body 10B, the first film 10 being stable is provided on the surface of the silicon carbide member 50. Therefore, even if the structure body 10B is taken out of the apparatus, the adverse effect is suppressed. This simplifies the process.

In the embodiment, the first treatment and the second treatment are performed after the formation of the first film 10. For example, when the first film 10 is formed after the first treatment, the surface of the silicon carbide member 50 is likely to be contaminated.

As shown in FIG. 2, the silicon carbide member 50 may include a first region 50r. In the first direction (Z-axis direction) from the silicon carbide member 50 to the first film 10, the first region 50r is separated from the interface 15 between the silicon carbide member 50 and the first film 10. For example, the first region 50r does not include nitrogen. Alternatively, the concentration of nitrogen at the interface 15 is higher than the concentration of nitrogen at the first region 50r. Nitrogen localized near the interface 15 terminates silicon near the interface with nitrogen. The first region 50r is a bulk region away from the interface. The distance between the interface 15 and the first region 50r may be, for example, 20 nm or more.

Figure 5:
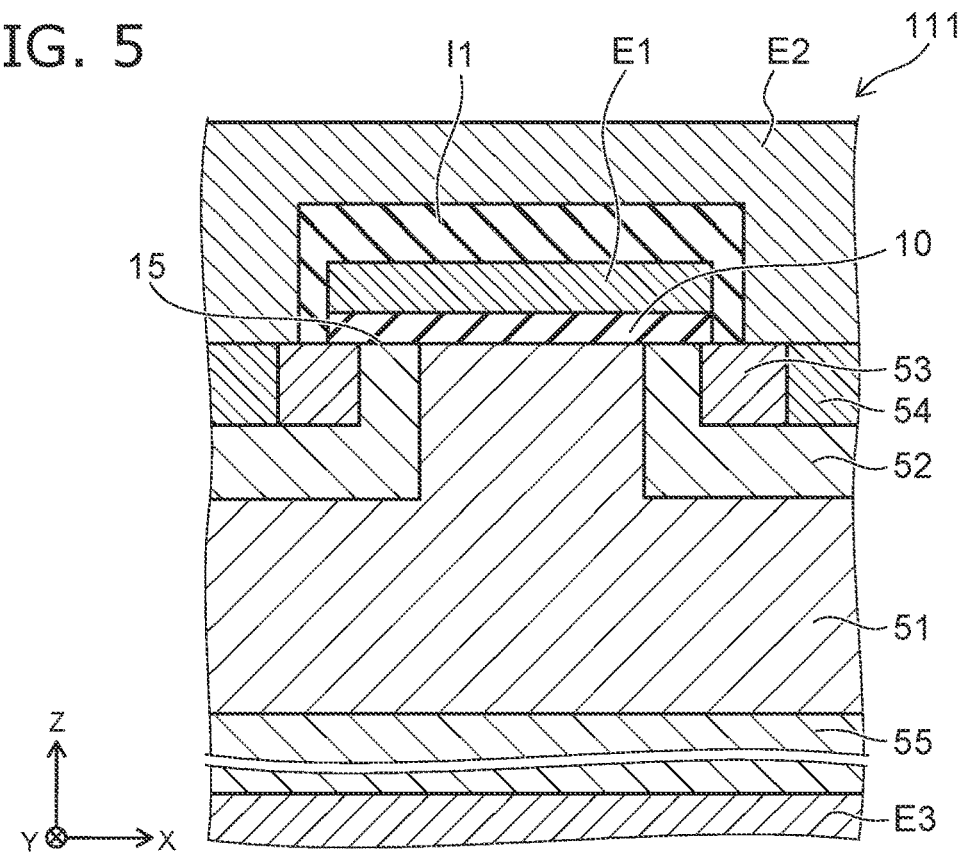
FIG. 5 is a schematic cross-sectional view illustrating the semiconductor device according to the embodiment.

FIG. 5 is a schematic cross-sectional view illustrating the semiconductor device according to the embodiment.

As shown in FIG. 5, a semiconductor device 111 includes a first semiconductor region 51 of a first conductive type, a second semiconductor region 52 of a second conductive type, a third semiconductor region 53 of the first conductive type, and a fourth semiconductor region 54 of the second conductive type, a first film 10, a first conductive film E1, a second conductive film E2, a third conductive film E3, and an insulating film I1. The semiconductor device 111 is a transistor. The semiconductor regions described above include, for example, silicon carbide. For example, the second semiconductor region 52 corresponds to the above-mentioned silicon carbide member 50. The first film 10 corresponds to, for example, a gate insulating film. The first conductive film E1 corresponds to the gate electrode. The second conductive film E2 corresponds to, for example, a source electrode. The third conductive film E3 corresponds to, for example, a drain electrode. In this example, a substrate 55 (SiC substrate) is provided.

A direction perpendicular to the Z-axis direction is the X-axis direction. The direction perpendicular to the Z-axis direction and the X-axis direction is the Y-axis direction.

In the Z-axis direction, in this example, the first conductive film E1 is provided between the second conductive film E2 and the third conductive film E3. The substrate 55 is located between the first conductive film E1 and the third conductive film E3. A part of the first semiconductor region 51 is located between the first conductive film E1 and the substrate 55. The first film 10 is located between the first conductive film E1 and this part of the first semiconductor region 51. The insulating film I1 is provided between the second conductive film E2 and the first conductive film E1. The insulating film I1 insulates between the second conductive film E2 and the first conductive film E1.

The second semiconductor region 52 is provided between another part of the first semiconductor region 51 and a part of the second conductive film E2. The third semiconductor region 53 and the fourth semiconductor region 54 are located between a part of the second semiconductor region 52 and the part of the second conductive film E2. In the X-axis direction, the third semiconductor region 53 is located between a part of the first semiconductor region 51 and the fourth semiconductor region 54. A part of the second semiconductor region 52 is located between the part of the first semiconductor region 51 and the third semiconductor region 53. The third semiconductor region 53 and the fourth semiconductor region 54 make ohmic contact with the second conductive film E2.

High mobility can be obtained in the semiconductor device 111.

The following is an example of the experimental result. In the experiment, structure body 10B is prepared. The structure body 10B includes the silicon carbide member 50 and the first film 10. In the experiment, the first film 10 is a $SiO_2$ film. In the first treatment, the structure body 10B is heat-treated in the first atmosphere including hydrogen. Then, in the second treatment, the structure body 10B is heat-treated in the second atmosphere including nitrogen and oxygen.

In the experiment described below, the second treatment includes a first step treatment and a second step treatment after the first step treatment. The first step treatment corresponds to the treatment of time tx1 illustrated in FIG. 3. The second step treatment corresponds to the treatment of time tx2 illustrated in FIG. 3. The temperature of the first step treatment is 1300° C. The atmosphere (second atmosphere) in the first step treatment includes nitrogen ($N_2$) including oxygen ($O_2$) at a concentration of 100 ppm. The temperature of the second step treatment is 1200° C. The atmosphere in the second step treatment includes oxygen-free nitrogen ($N_2$).

After the second treatment, the first conductive film E1 is formed on the first film 10. On the other hand, another conductive film is formed under the silicon carbide member 50. A voltage is applied between the other conductive film and the first conductive film E1. The capacitance between another conductive film and the first conductive film E1 when the applied voltage is changed is measured. From the measurement results, the interface state density can be obtained.

Figure 6A:
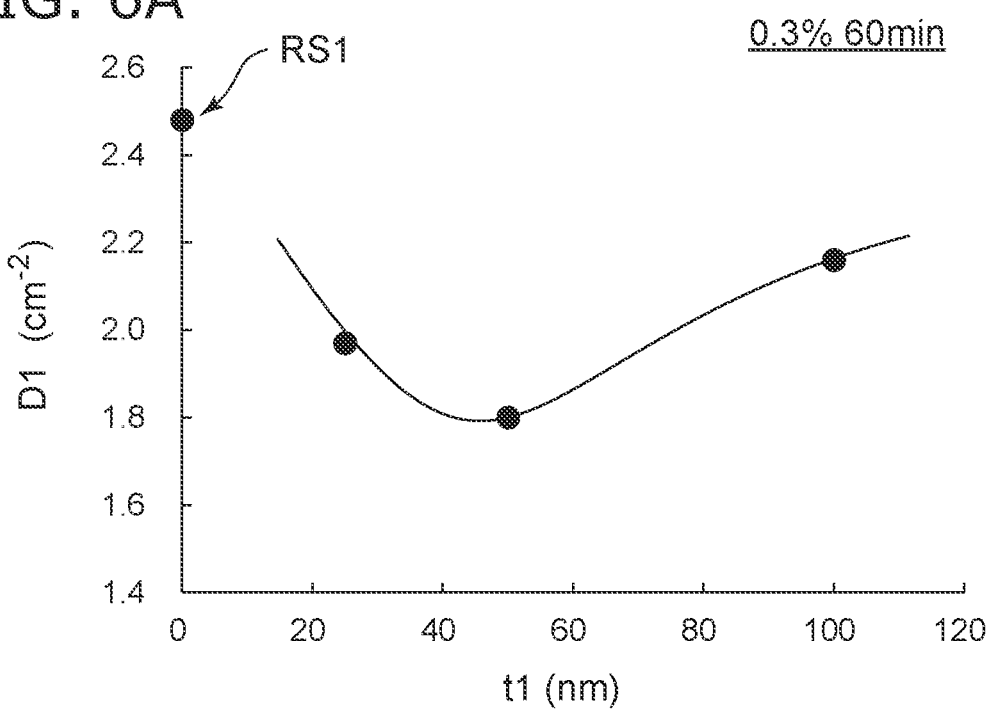
FIGS. 6A and 6B are graphs illustrating characteristics in the semiconductor device.
Figure 6B:
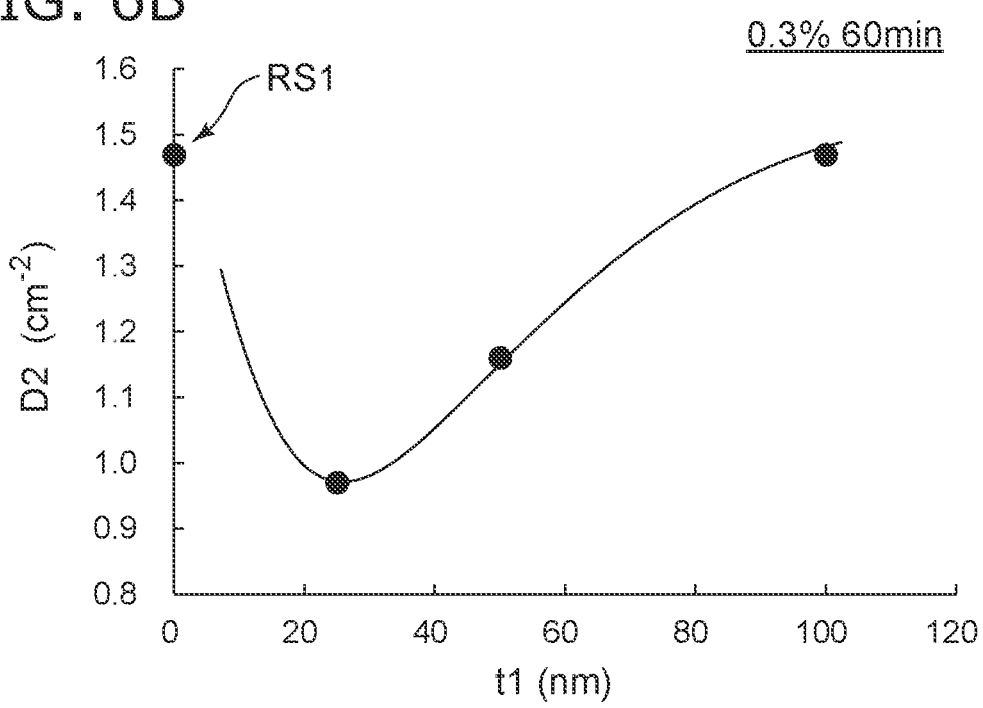

FIGS. 6A and 6B are graphs illustrating the characteristics of the semiconductor device.

In the examples of FIGS. 6A and 6B, the first atmosphere in the first treatment is nitrogen ($N_2$) including 0.3% hydrogen. In the first treatment, heat treatment is performed at 1350° C. for 60 minutes. After that, the above-mentioned second treatment is performed. The horizontal axis of these graphs is the thickness t1 of the first film 10.

The vertical axis of FIG. 6A is the interface state density D1. The interface state density D1 corresponds to the interface state density of 0.2 eV. The vertical axis of FIG. 6B is the interface state density D2. The interface state density D2 corresponds to the interface state density of 0.5 eV. In FIGS. 6A and 6B, a result of a first reference sample RS1 in which the first treatment is not performed is conveniently shown at the position where the thickness t1 is 0 nm. In the first reference sample RS1, the thickness t1 is 55 nm.

As shown in FIG. 6A, when the thickness t1 is 25 nm to 100 nm, the interface state density D1 is lower than the interface state density D1 in the first reference sample RS1. As shown in FIG. 6B, when the thickness t1 is 25 nm to 50 nm, the interface state density D2 is lower than the interface state density D1 in the first reference sample RS1. As described above, by performing the first treatment in the first atmosphere including hydrogen, a low interface state density can be obtained.

Figure 7A:
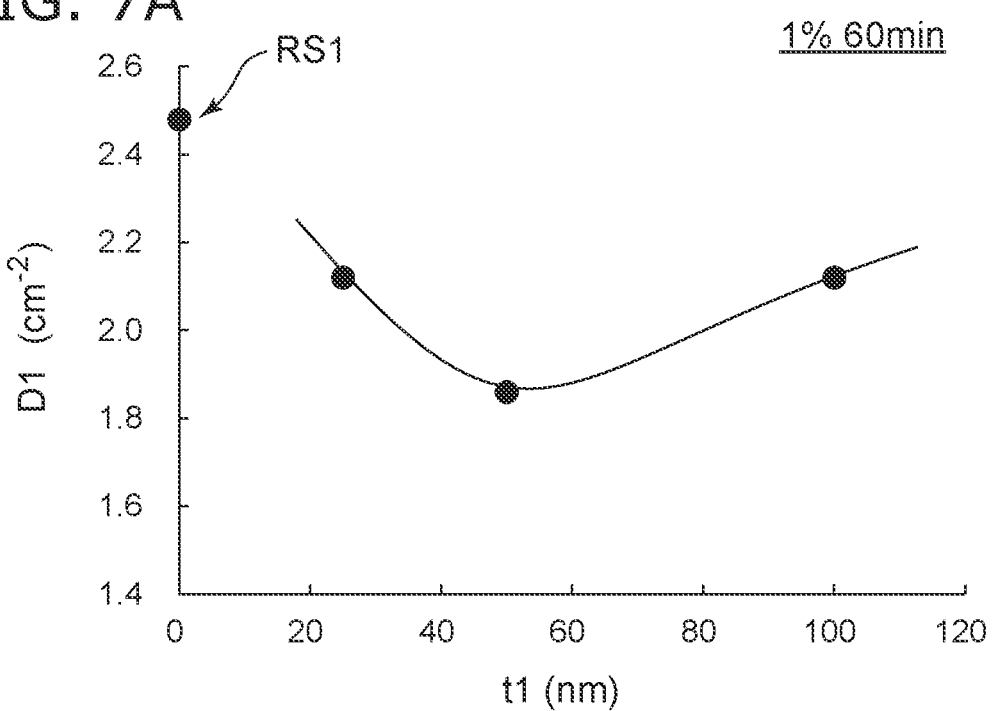
FIGS. 7A and 7B are graphs illustrating characteristics in the semiconductor device.
Figure 7B:
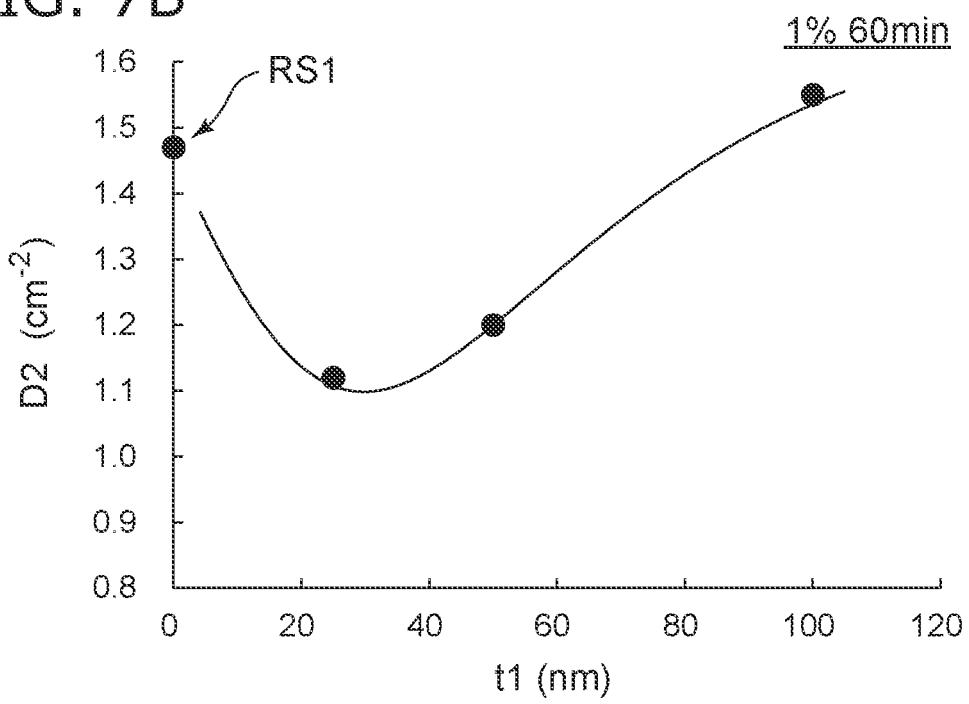

FIGS. 7A and 7B are graphs illustrating the characteristics of the semiconductor device.

In the examples of FIGS. 7A and 7B, the first atmosphere in the first treatment is nitrogen ($N_2$) including 1% hydrogen. In the first treatment, the heat treatment is performed at 1350° C. for 60 minutes. After that, the above-mentioned second treatment is performed. The horizontal axis of these graphs is the thickness t1 of the first film 10.

The vertical axis of FIG. 7A is the interface state density D1. The vertical axis of FIG. 7B is the interface state density D2. In FIGS. 7A and 7B, the result of the first reference sample RS1 in which the first treatment is not performed is conveniently shown at the position where the thickness t1 is 0 nm.

As shown in FIG. 7A, when the thickness t1 is 25 nm to 100 nm, the interface state density D1 is lower than the interface state density D1 in the first reference sample RS1. As shown in FIG. 7B, when the thickness t1 is 25 nm to 50 nm, the interface state density D2 is lower than the interface state density D1 in the first reference sample RS1. As described above, by performing the first treatment in the first atmosphere including hydrogen, a low interface state density can be obtained.

FIGS. 8A and 8B are graphs illustrating the characteristics of the semiconductor device.

In the examples of FIGS. 8A and 8B, the first atmosphere in the first treatment is nitrogen ($N_2$) including 5% hydrogen. In the first treatment, heat treatment is performed at 1350° C. for 10 minutes. After that, the above-mentioned second treatment is performed. The horizontal axis of these graphs is the thickness t1 of the first film 10.

The vertical axis of FIG. 8A is the interface state density D1. The vertical axis of FIG. 8B is the interface state density D2. In FIGS. 8A and 8B, the result of the first reference sample RS1 in which the first treatment is not performed is conveniently shown at the position where the thickness t1 is 0 nm.

As shown in FIG. 8A, when the thickness t1 is 25 nm to 60 nm, the interface state density D1 is lower than the interface state density D1 in the first reference sample RS1. As shown in FIG. 8B, when the thickness t1 is 25 nm to 60 nm, the interface state density D2 is lower than the interface state density D1 in the first reference sample RS1. Thus, by performing the first treatment in the first atmosphere including hydrogen, a low interface state density can be obtained.

From the above results, the thickness t1 of the first film 10 is preferably not less than 25 nm and less than 90 nm. The thickness t1 may be not less than 25 nm and not more than 80 nm. The thickness t1 may be not less than 25 nm and not more than 60 nm.

In another experiment, the temperature in the first treatment is set to 1370° C., and then the second treatment is performed. The interface state density in this case is not sufficiently lower than the interface state density in the first reference sample RS1 in which the first treatment is not performed. In the embodiment, the temperature (maximum temperature) in the first treatment is preferably less than 1370° C. (for example, 1350° C. or lower).

As described above, a low interface state density can be obtained by the first treatment with the first atmosphere including hydrogen and the second treatment with the second atmosphere including oxygen and nitrogen, performed after the first treatment. It was found that a specific profile can be obtained in the structure body 10B including the silicon carbide member 50 and the first film 10 by performing such a special treatment.

FIGS. 9 to 14 are graphs illustrating the characteristics of the semiconductor device.

Figure 9:
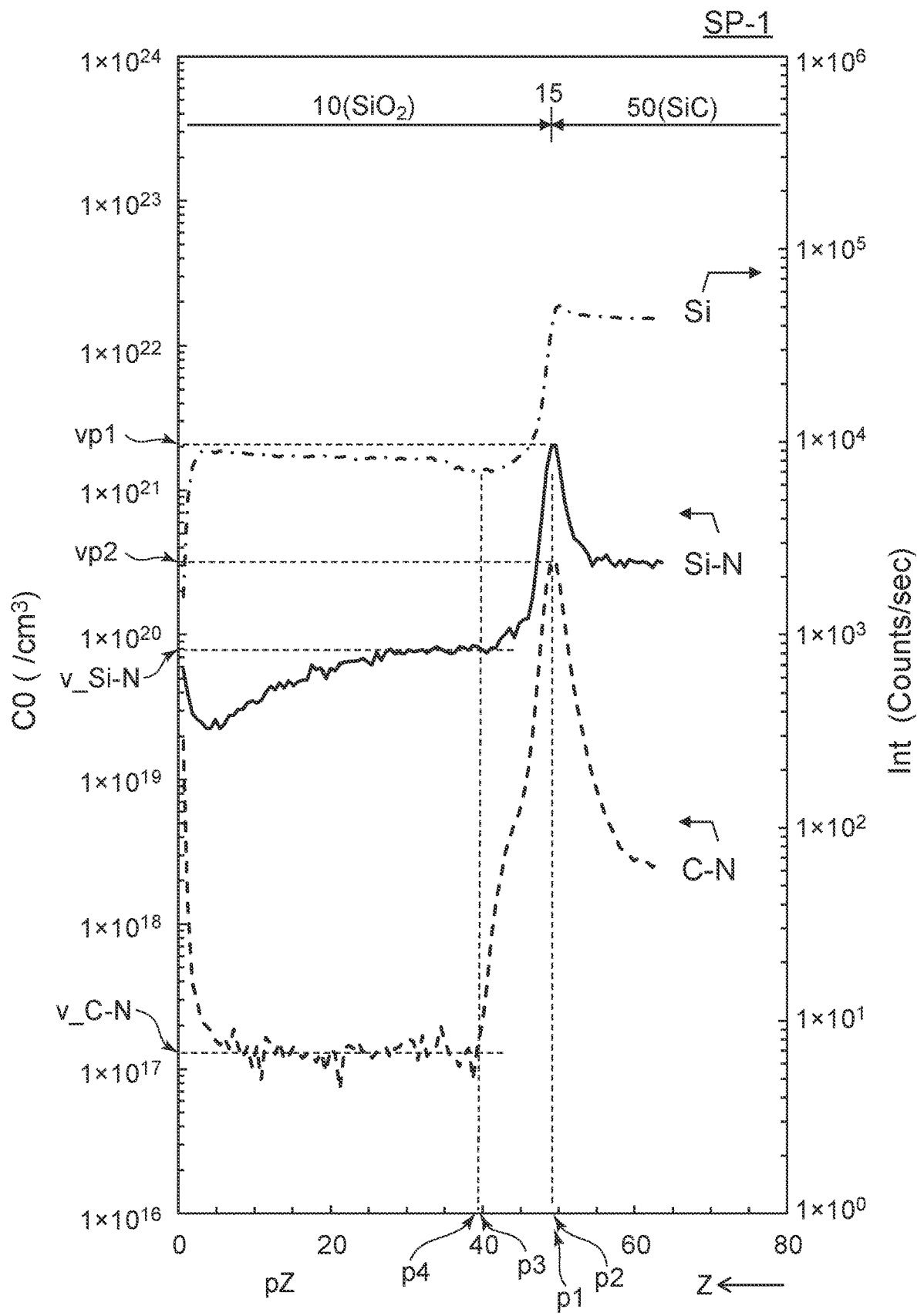
FIG. 9 is a graph illustrating characteristics in the semiconductor device.
Figure 11:
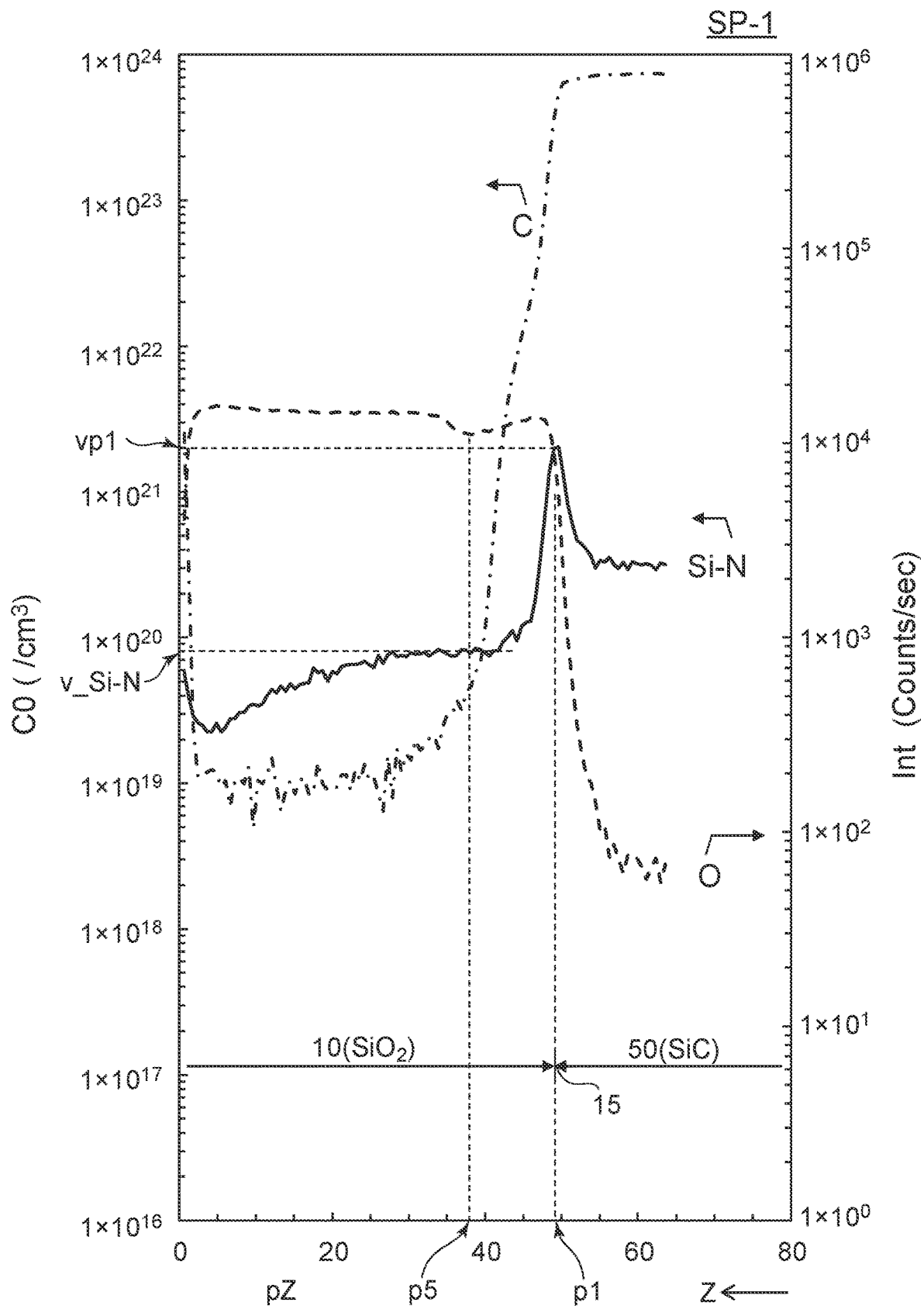
FIG. 11 is a graph illustrating characteristics in a semiconductor device.
Figure 13:
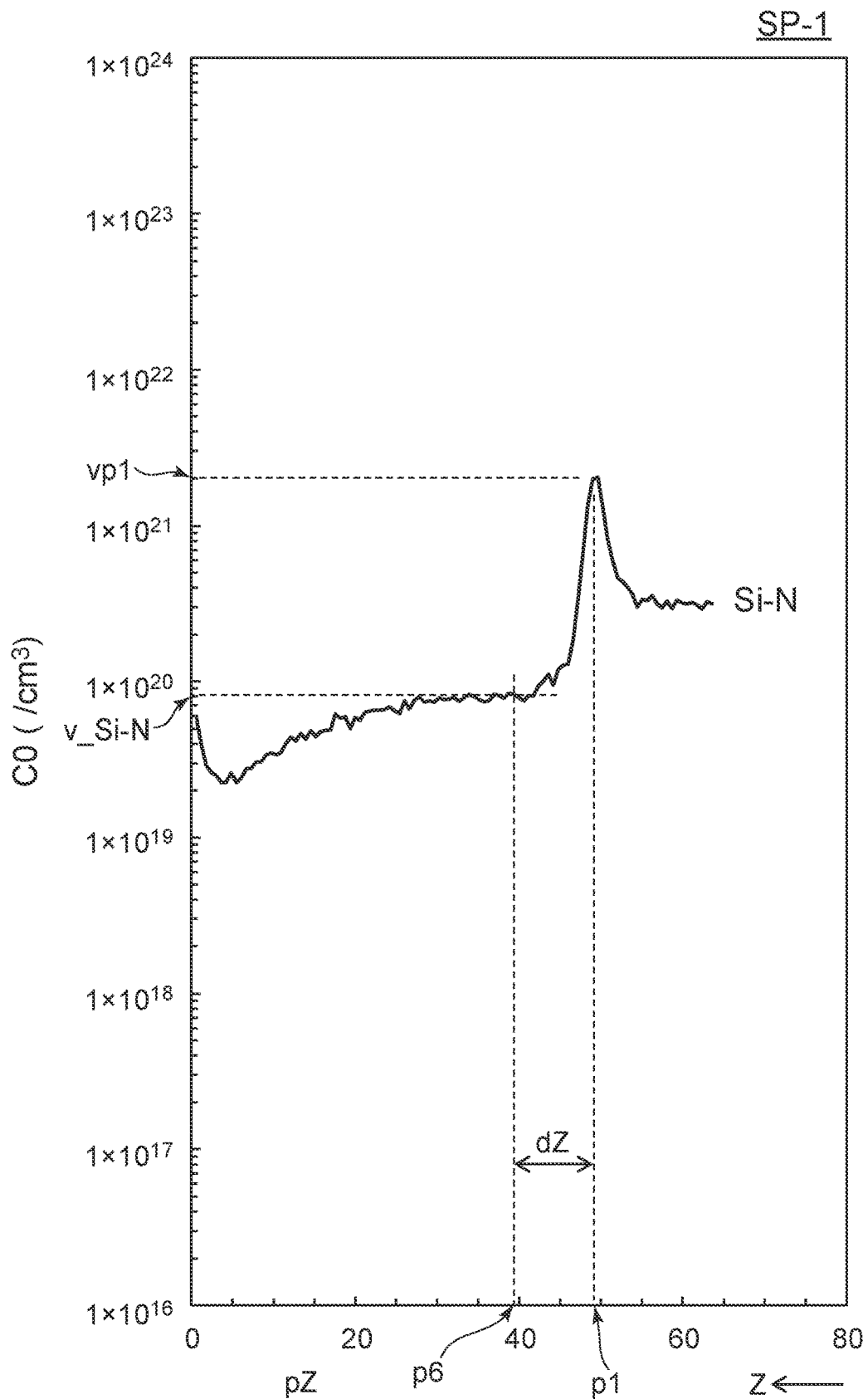
FIG. 13 is a graph illustrating characteristics in the semiconductor device.

The TOF-SIMS (Time-of-Flight Secondary Ion Mass Spectrometry) analysis results in the first sample SP1 and the second sample SP2 are illustrated. FIGS. 9, 11 and 13 correspond to the first sample SP1. In the first sample SP1, the thickness t1 of the first film 10 is 50 nm. In the first sample SP1, the first treatment for 60 minutes is performed at 1350° C. in the first atmosphere including 1% (volume ratio) of hydrogen, and then the second treatment is performed. In the second treatment, the above-mentioned first step treatment and the second step treatment are performed.

Figure 10:
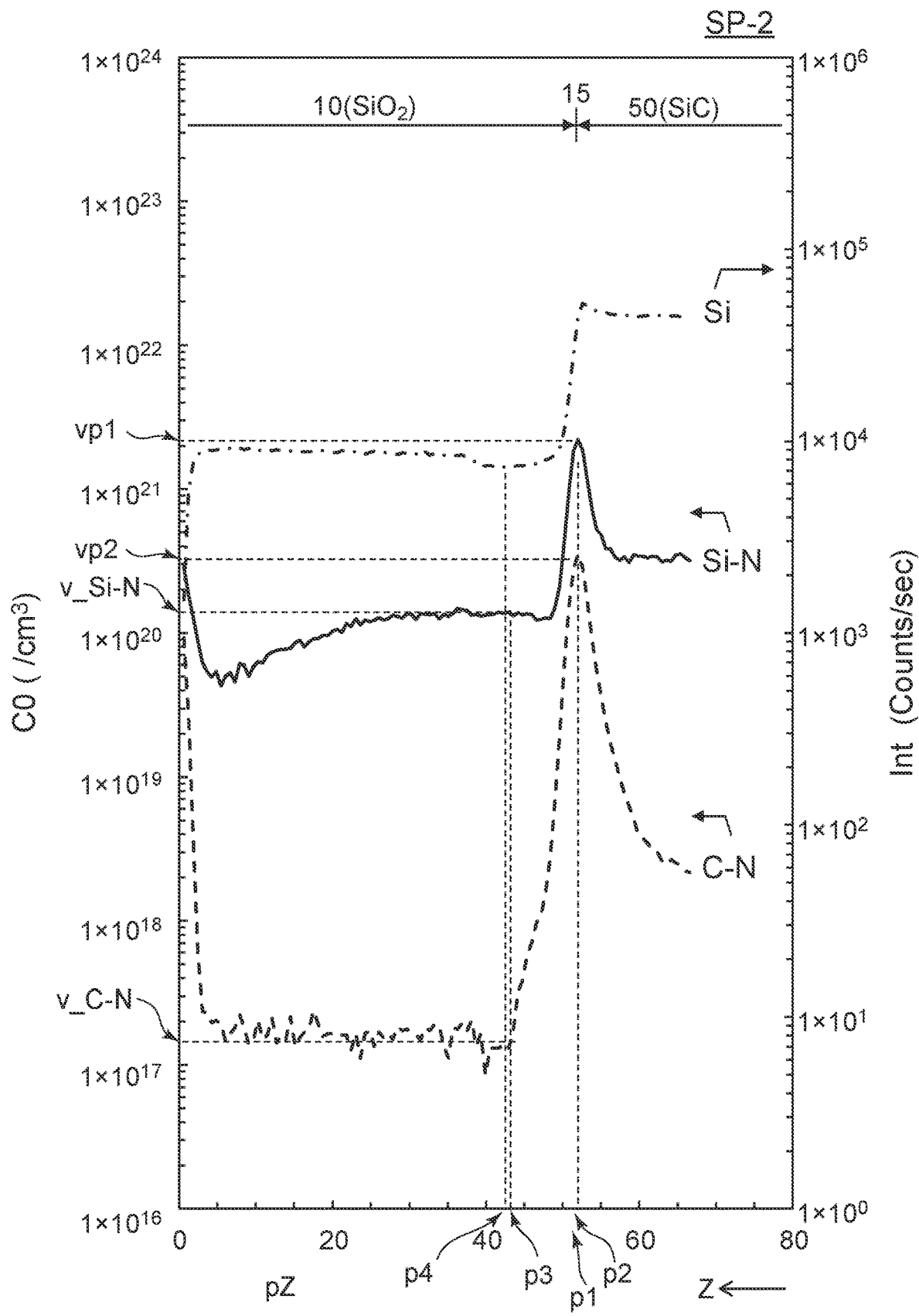
FIG. 10 is a graph illustrating characteristics in the semiconductor device.
Figure 12:
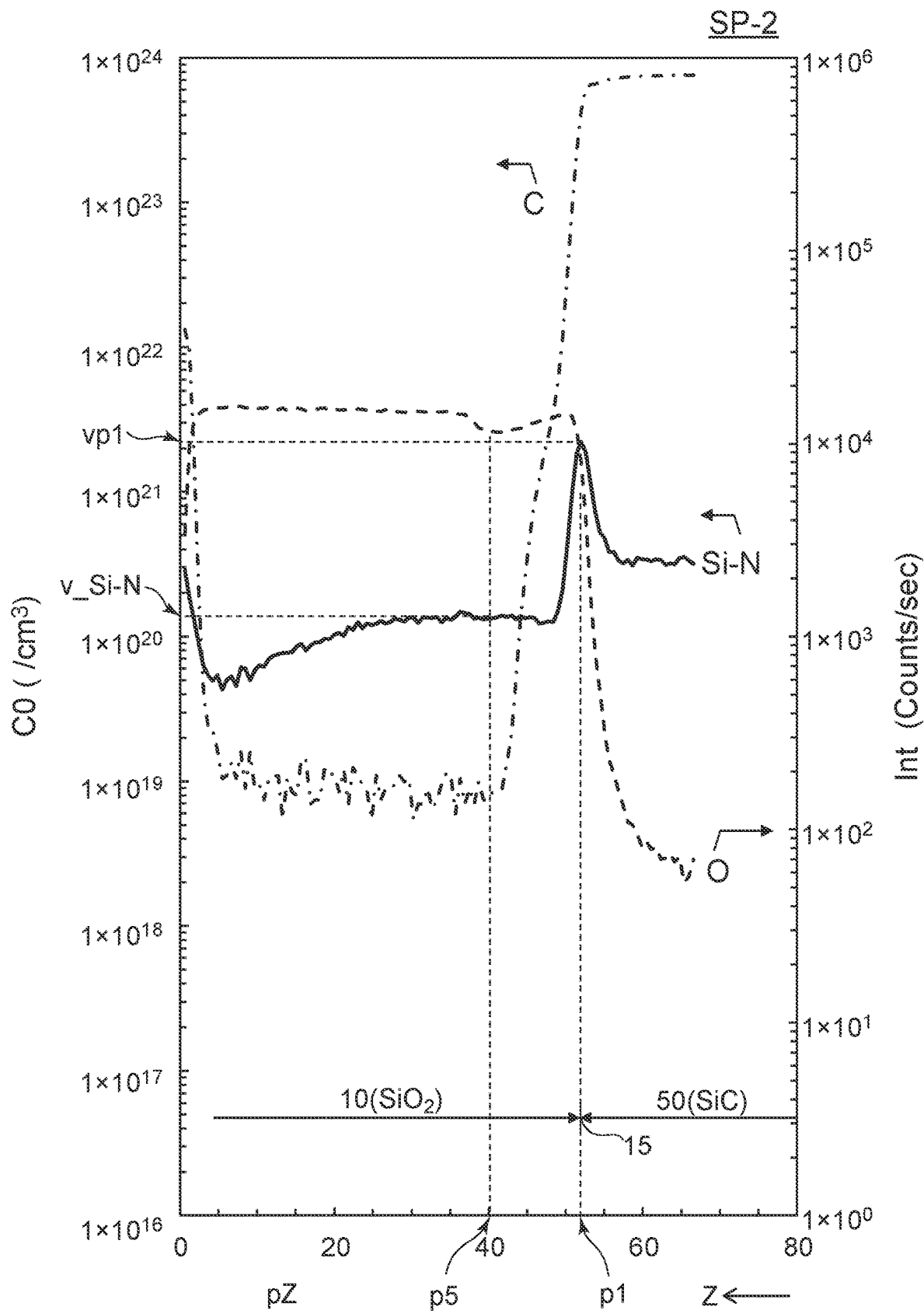
FIG. 12 is a graph illustrating characteristics in the semiconductor device.
Figure 14:
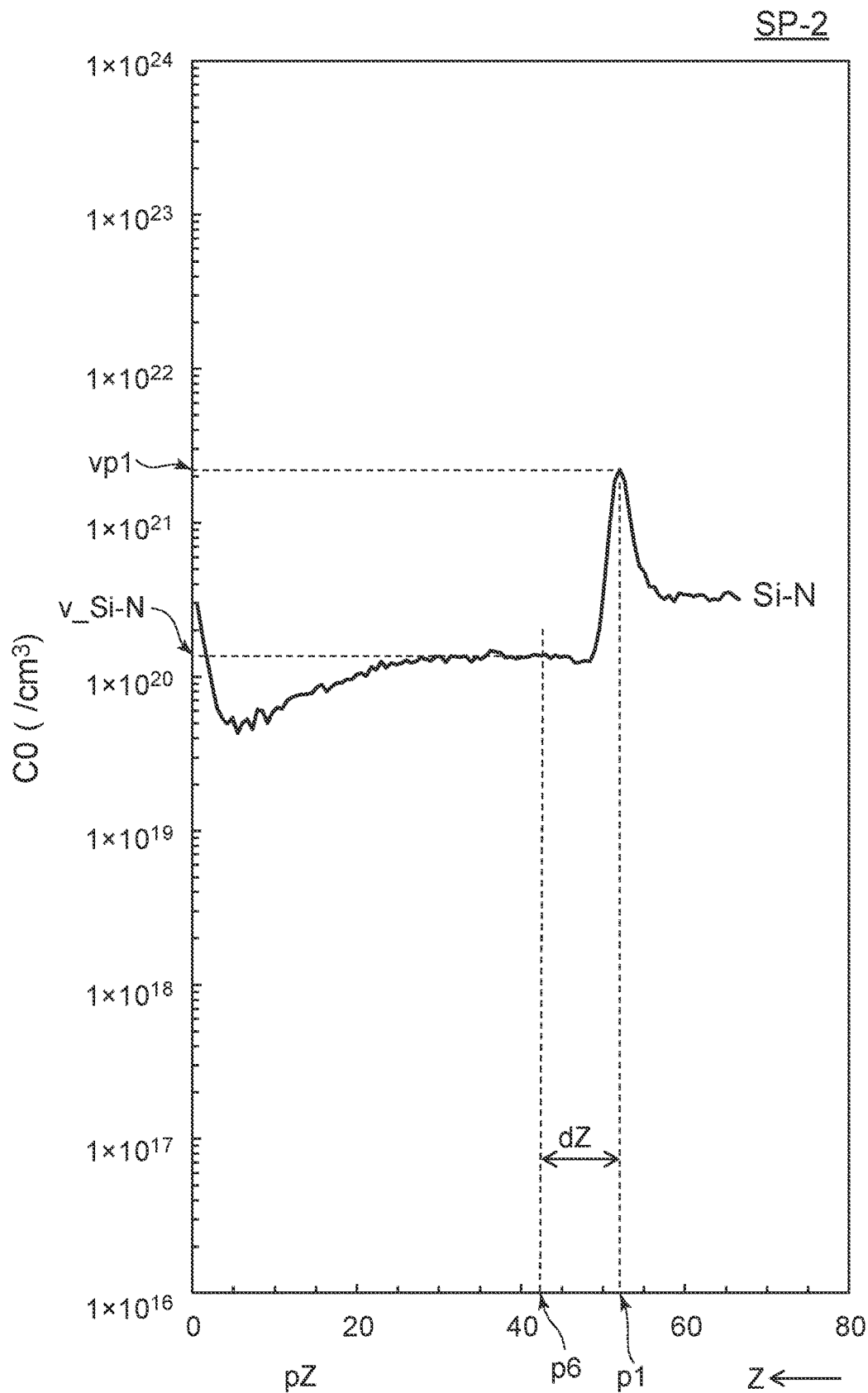
FIG. 14 is a graph illustrating characteristics in the semiconductor device.

FIGS. 10, 12, and 14 correspond to the second sample SP2. In the second sample SP2, the thickness t1 of the first film 10 is 50 nm. In the second sample SP2, the first treatment is not performed, but the second treatment is performed. In the second treatment, the above-mentioned first step treatment and second step treatment are performed. The second sample SP2 corresponds to the above-mentioned first reference sample RS1. The interface state density in the first sample SP1 is lower than the interface state density in the second sample SP2.

The horizontal axis in these figures is the position pZ along the Z-axis direction. The vertical axis on the left side of FIGS. 9 and 10 is the concentration CO of Si—N bond or C—N bond. The vertical axis on the right side of FIGS. 9 and 10 is the secondary ion strength Int of Si. The secondary ion strength Int of Si corresponds to the concentration of Si.

The vertical axis on the left side of FIGS. 11 and 12 is the concentration CO of the Si—N bond or C (carbon). The vertical axis on the right side of FIGS. 11 and 12 is the secondary ion strength Int of O (oxygen). The secondary ion strength Int of oxygen corresponds to the concentration of oxygen. The vertical axis of FIGS. 13 and 14 is the concentration CO of S—N bond.

As shown in FIG. 9, in the first sample SP1, the profile of the concentration of Si—N bond has a peak. On the left side of the figure from the peak position, the concentration of Si—N bonds is sufficiently reduced.

As shown in FIG. 10, in the second sample SP2, the profile of the concentration of Si—N bond has a peak. On the left side of the figure from the position of the peak, the concentration of Si—N bond is higher than the concentration in the first sample SP1. As described above, there is a difference in the profile of the concentration of Si—N bond between the first sample SP1 and the second sample SP2.

For example, as shown in FIG. 9, at the first position p1 in the first direction (Z-axis direction) from the silicon carbide member 50 to the first film 10, the Si—N concentration of the bond of silicon and nitrogen is the first peak value vp1. In the first sample SP1, the first peak value vp1 is about $2.0 \times 10^{21}/cm^3$. At a second position p2 in the first direction, the C—N concentration of a bond of carbon and nitrogen is the second peak value vp2. In the first sample SP1, the second peak value vp2 is about $3.2 \times 10^{20}/cm^3$. At a third position p3 in the first direction, the C—N concentration is low and stable. In this example, at the third position p3 in the first direction, the C—N concentration v_C—N is about $1.1 \times 10^{17}/cm^3$, at the third position p3 in the first direction, the C—N concentration v_C—N is 1/2800 of the second peak value vp2. The third position p3 is a position where the C—N concentration v_C—N becomes 1/2800 of the second peak value vp2 in the direction from the silicon carbide member 50 to the first film 10.

In this example, in the first sample SP1, the Si—N concentration v_Si—N at the third position p3 is 1/24 of the first peak value vp1. In the embodiment, the Si—N concentration (v_Si—N) at the third position p3 is, for example, less than 1/20 of the first peak value vp1.

On the other hand, in the second sample SP2 shown in FIG. 10, the Si—N concentration of the bond with silicon at the first position p1 is the first peak value vp1. In the second sample SP2, the first peak value vp1 is about $2.2 \times 10^{21}/cm^3$. At the second position p2 in the first direction, the C—N concentration of the bond of carbon and nitrogen is the second peak value vp2. In the second sample SP2, the second peak value vp2 is about $3.5 \times 10^{20}/cm^3$. At the third position p3 in the first direction, the C—N concentration v_C—N is about $1.3 \times 10^{17}/cm^3$. As described above, in the second sample SP2, at the third position p3 in the first direction, the C—N concentration v_C—N is 1/2800 of the second peak value vp2.

In the second sample SP2, the Si—N concentration (v_Si—N) at the third position p3 is $1.4 \times 10^{20}/cm^3$. As described above, in the second sample SP2, the Si—N concentration (v_Si—N) at the third position p3 is 1/16 of the first peak value vp1. In the second sample SP2, the Si—N concentration v_Si—N) at the third position p3 is 1/20 or more of the first peak value vp1. In the second sample SP2, the Si—N concentration is not sufficiently low.

In the embodiment, it is considered that a low interface state density can be obtained by the sufficiently low Si—N concentration (v_Si—N) at the third position p3.

For example, in the embodiment, the first peak value vp1 may be $1.7 \times 10^{21}/cm^3$ or more. At the second position p2 in the first direction, the C—N concentration of the bond of carbon and nitrogen is the second peak value bp2. The C—N concentration (v_C—N) at the third position p3 in the first direction is 1/2800 of the second peak value vp2. The Si—N concentration (v_Si—N) at the third position p3 is $1.0 \times 10^{20}/cm^3$ or less. In the embodiment, it is considered that a low interface state density can be obtained by the sufficiently low Si—N concentration (v_Si—N) at the third position p3. The first peak value vp1 may be $1.9 \times 10^{21}/cm^3$ or more. The Si—N concentration (v_Si—N) at the third position p3 may be $0.9 \times 10^{20}/cm^3$ or less.

As shown in FIGS. 9 and 10, the first position p1 substantially coincides with the position of the interface 15 between the silicon carbide member 50 and the first film 10. At the interface 15, the Si—N concentration of the bond of silicon and nitrogen becomes the first peak value vp1. Information regarding the position of the interface 15 may be obtained from, for example, electron microscopic observation of the structure body 10B. The second position p2 may substantially coincide with the first position p1.

As shown in FIGS. 9 and 10, the concentration of Si becomes the minimum in the first film 10. This minimum position is, for example, the fourth position p4. There is a difference between the first sample SP1 and the second sample SP2 in the Si—N concentration (v_Si—N) at the fourth position p4. In the TOF-SIMS profile, there is a surface effect in the surface region of the sample (in the example of FIGS. 9 and 10, the region where the pZ on the left side of the figure is 5 nm or less). Therefore, the surface region of the sample is ignored in determining the position of the minimum concentration of Si.

As shown in FIG. 9, at the first position p1 in the first direction (Z-axis direction) from the silicon carbide member 50 to the first film 10, the Si—N concentration of the bond of silicon and nitrogen is the first peak value vp1. At the fourth position p4 in the first direction, the concentration of silicon is the minimum value in the first film 10. In the example of FIG. 9, the Si—N concentration (v_Si—N) at the fourth position p4 is 1/24 of the first peak value vp1. As described above, in the embodiment, the Si—N concentration (v_Si—N) at the fourth position p4 is less than 1/20 of the first peak value vp1.

In the second sample SP2 shown in FIG. 10, the Si—N concentration (v_Si—N) at the fourth position p4 is 1/16 of the first peak value vp1.

As shown in FIG. 9, in the embodiment, the first peak value vp1 is $1.7 \times 10^{21}/cm^3$ or more. In this example, the first peak value vp1 is $2.0 \times 10^{21}/cm^3$. At the fourth position p4 in the first direction, the concentration of silicon is the minimum value in the first film 10. The Si—N concentration (v_Si—N) at the fourth position p4 is $1.0 \times 10^{20}/cm^3$ or less. In the example shown in FIG. 9, the Si—N concentration (v_Si—N) at the fourth position p4 is $0.8 \times 10^{20}/cm^3$.

In the second sample SP2 shown in FIG. 10, the first peak value vp1 is $2.2 \times 10^{21}/cm^3$ or more, and the Si—N concentration (v_Si—N) at the fourth position p4 is $1.4 \times 10^{20}/cm^3$.

As shown in FIGS. 11 and 12, the oxygen concentration becomes minimum in the first film 10. The minimum position is, for example, the fifth position p5. There is a difference between the first sample SP1 and the second sample SP2 in the Si—N concentration at the fifth position p5. In the TOF-SIMS profile, the surface region of the sample is ignored in determining the location of the minimum oxygen concentration.

As shown in FIG. 11, at the first position p1, the Si—N concentration of the bond of silicon and nitrogen is the first peak value vp1. At the fifth position p5 in the first direction, the oxygen concentration is the minimum value in the first film 10. In the example of FIG. 9, the Si—N concentration (v_Si—N) at the fifth position p5 is 1/24 of the first peak value vp1. In the embodiment, for example, the Si—N concentration (v_Si—N) at the fifth position p5 is less than 1/20 of the first peak value vp1.

In the second sample SP2 shown in FIG. 12, the Si—N concentration (v_Si—N) at the fifth position p5 is 1/16 of the first peak value vp1.

As shown in FIG. 11, in the embodiment, the first peak value vp1 is $1.7 \times 10^{21}/cm^3$ or more. In this example, the first peak value vp1 is $2.0 \times 10^{21}/cm^3$. At the fifth position p5 in the first direction, the concentration of silicon is the minimum value in the first film 10. The Si—N concentration (v_Si—N) at the fifth position p5 is $1.0 \times 10^{20}/cm^3$ or less. In the example shown in FIG. 11, the Si—N concentration (v_Si—N) at the fifth position p5 is $0.8 \times 10^{20}/cm^3$.

In the second sample SP2 shown in FIG. 12, the first peak value vp1 is $2.2 \times 10^{21}/cm^3$ or more, and the Si—N concentration (v_Si—N) at the fifth position p5 is $1.4 \times 10^{20}/cm^3$.

As shown in FIGS. 13 and 14, there is a position (sixth position p6) of 10 nm from the first position p1 (for example, the interface 15) in the direction from the silicon carbide member 50 to the first film 10. There is a difference between the first sample SP1 and the second sample SP2 in the Si—N concentration (v_Si—N) at the sixth position p6.

For example, as shown in FIG. 13, at the first position p1 in the first direction, the Si—N concentration of the bond of silicon and nitrogen is the first peak value vp1. In the embodiment, the Si—N concentration v_Si—N) at the sixth position p6 in the first direction is less than 1/20 of the first peak value. In the example of FIG. 9, the Si—N concentration v_Si—N) at the sixth position p6 is 1/24 of the first peak value. The sixth position p6 is in the first film 10. The distance dZ in the first direction between the first position p1 and the sixth position p6 is 10 nm. The low Si—N concentration (v_Si—N) at the sixth position p6 provides a low interface state density.

In the second sample SP2 shown in FIG. 14, the Si—N concentration (v_Si—N) at the sixth position p6 is 1/16 of the first peak value vp1.

As shown in FIG. 13, at the first position p1 in the first direction, the Si—N concentration of the bond of silicon and nitrogen is the first peak value vp1. In the embodiment, the first peak value is $1.7 \times 10^{21}/cm^3$ or more. In the embodiment, at the sixth position p6 in the first direction, the Si—N concentration (v_Si—N) is $1.0 \times 10^{20}/cm^3$ or less. The sixth position p6 is in the first film 10. The distance dZ in the first direction between the first position p1 and the sixth position p6 is 10 nm.

A low interface state density can be obtained by having a low Si—N concentration (v_Si—N) at at least one of the third position p3, the fourth position p4, the fifth position p5, and the sixth position p6 as described above. For example, high carrier mobility can be obtained.

In the embodiment, it is considered that the Si—N concentration (v_Si—N) is lowered at at least one of the third position p3, the fourth position p4, the fifth position p5, and the sixth position p6, for example, by the first treatment is due to densified of the first film 10.

In the example according to the embodiment, a special structure in which the concentration of Si is minimized at the fourth position p4 may be obtained. In the example according to the embodiment, a special structure in which the oxygen concentration is minimized at the fifth position p5 may be obtained.

Figure 15:
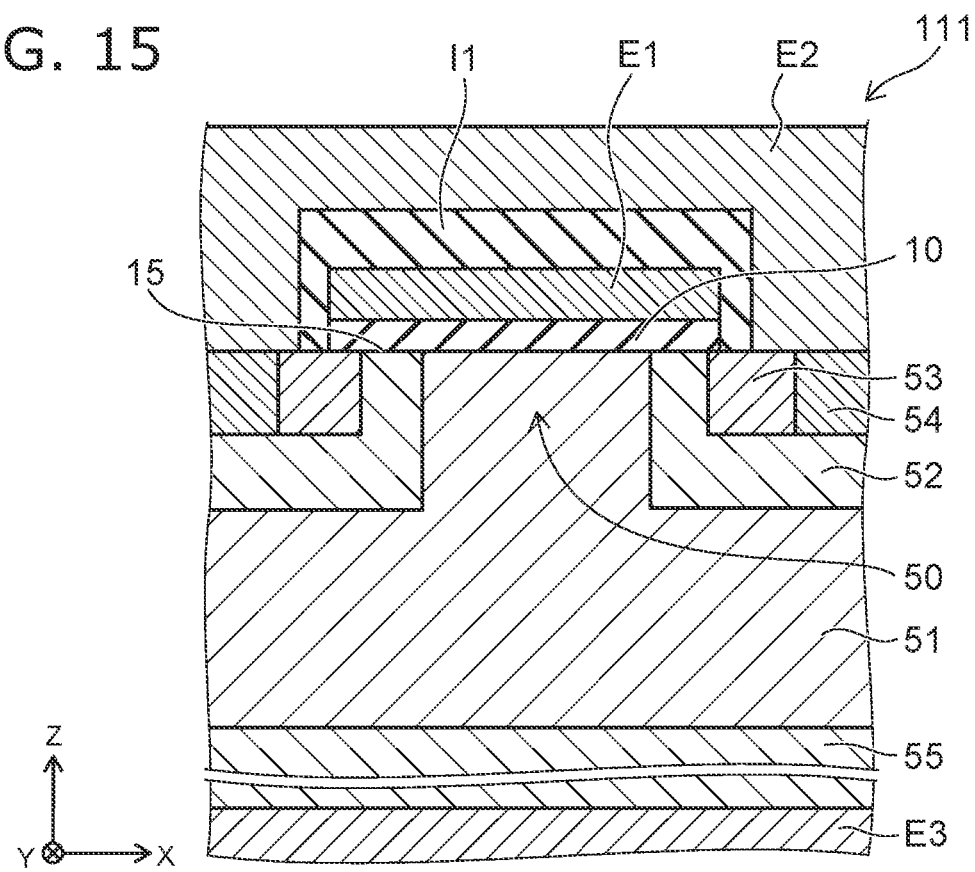
FIG. 15 is a schematic cross-sectional view illustrating the semiconductor device according to the embodiment.

FIG. 15 is a schematic cross-sectional view illustrating the semiconductor device according to the embodiment.

As shown in FIG. 15, in the semiconductor device 111 according to the embodiment, the silicon carbide member 50 may be the first semiconductor region 51 of the first conductive type. The silicon carbide member 50 may be, for example, an n-type semiconductor region.

In the first sample SP1 and the second sample SP2 described above, the silicon carbide member 50 is n-type. In the silicon carbide member 50 in the first sample SP1 and the second sample SP2, the concentration of the n-type impurity (N in this example) is about $5 \times 10^{15}/cm^3$. In the embodiment, the concentration of the n-type impurity (P or N) in the silicon carbide member 50 (first semiconductor region 51) may be not less than $1 \times 10^{15}/cm^3$ and not more than $5 \times 10^{20}/cm^3$. The concentration of the n-type impurity (P or N) in the first semiconductor region 51 may be not less than $1 \times 10^{16}/cm^3$ and not more than $5 \times 10^{18}/cm^3$. As described above, in the embodiment, the silicon carbide member 50 may correspond to the second semiconductor region 52 of the second conductive type.

When the silicon carbide member 50 according to the embodiment is provided in the semiconductor device 111, the silicon carbide member 50 may be applied to a region to which an electric field is applied during the operation of the semiconductor device 111. The silicon carbide member 50 may be applied to a region that is at least a part of the current path during operation of the semiconductor device 111. The low interface state density provides stable operation.

The embodiments may include the following configurations (for example, technical proposals).

(Configuration 1)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
a C—N concentration of a bond of carbon and nitrogen at a second position in the first direction being a second peak value,
at a third position in the first direction, the C—N concentration being 1/2800 of the second peak value, and
the Si—N concentration at the third position being less than 1/20 of the first peak value.

(Configuration 2)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
the first peak value being $1.7 \times 10^{21}/cm^3$ or more,
a C—N concentration of a bond of carbon and nitrogen at a second position in the first direction being a second peak value,
a C—N concentration at a third position in the first direction being 1/2800 of the second peak value, and
a Si—N concentration at the third position being $1.0 \times 10^{20}/cm^3$ or less.

(Configuration 3)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
at a fourth position in the first direction, a concentration of silicon being a minimum value in the first film, and
a Si—N concentration at the fourth position being less than 1/20 of the first peak value.

(Configuration 4)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
the first peak value being $1.7 \times 10^{21}/cm^3$ or more,
at a fourth position in the first direction, a silicon concentration being a minimum value in the first film, and
a Si—N concentration at the fourth position being $1.0 \times 10^{20}/cm^3$ or less.

(Configuration 5)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
at a fifth position in the first direction, an oxygen concentration being a minimum value in the first film, and
a Si—N concentration at the fifth position being less than 1/20 of the first peak value.

(Configuration 6)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
the first peak value being $1.7 \times 10^{21}/cm^3$,
at a fifth position in the first direction, an oxygen concentration being a minimum value in the first film, and
a Si—N concentration at the fifth position being $1.0 \times 10^{20}/cm^3$ or less.

(Configuration 7)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
a Si—N concentration at a sixth position in the first direction being less than 1/20 of the first peak value,
the sixth position being in the first film, and
a distance between the first position and the sixth position in the first direction being 10 nm.

(Configuration 8)
A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
the first peak value is $1.7 \times 10^{21}/cm^3$,
a Si—N concentration at a sixth position in the first direction being $1.0 \times 10^{20}/cm^3$ or less,
the sixth position being in the first film, and
a distance between the first position and the sixth position in the first direction being 10 nm.

(Configuration 9)
The device according to any one of configuration 1-8, further comprising a first conductive film, and
the first film being provided between the silicon carbide member and the first conductive film.

(Configuration 10)
A method for manufacturing a semiconductor device, comprising:
preparing a structure body, the structure body including a silicon carbide member and a first film stacked with the silicon carbide member, the first film including silicon and oxygen;
performing a first treatment of heat-treating the structure body in a first atmosphere including hydrogen; and
after the first treatment, performing a second treatment of heat-treating the structure body in a second atmosphere including nitrogen and oxygen, an oxygen concentration in the second atmosphere being not less than 5 ppm and not more than 1000 ppm.
(Configuration 11)
The method according to configuration 10, wherein a temperature in the second treatment is not less than 1200° C. and not more than 1300° C.
(Configuration 12)
The method according to configuration 11, wherein in the second treatment, a time exceeding 1200° C. is not less than 1 hour and not more than 20 hours.
(Configuration 13)
The method according to any one of configurations 10-12, wherein
the oxygen in the second atmosphere is $O_2$, and
the nitrogen in the second atmosphere is $N_2$.
(Configuration 14)
The method according to any one of configurations 10-13, wherein a concentration of the nitrogen included in the second atmosphere is not less than 0.1% and less than 100%.
(Configuration 15)
The method according to any one of configurations 10-14, wherein a thickness of the first film is not less than 25 nm and not more than 60 nm.
(Configuration 16)
The method according to any one of configurations 10-15, wherein the first film is in contact with the silicon carbide member.
(Configuration 17)
The method according to any one of configurations 10-16, wherein a concentration of hydrogen in the first atmosphere is not less than 0.01% and not more than 100%.
(Configuration 18)
The method according to any one of configurations 10-17, wherein a temperature in the first treatment is not less than 1200° C. and not more than 1350° C.
(Configuration 19)
The method according to configuration 18, wherein a time of the first treatment is not less than 15 minutes and not more than 10 hours.
(Configuration 20)
The method according to any one of configurations 10-19, wherein the second treatment includes binding nitrogen to silicon present in a region between the silicon carbide member and the first film.
(Configuration 21)
The method according to any one of configurations 10-20, wherein
the silicon carbide member includes a first region,
in a first direction from the silicon carbide member to the first film, the first region is separated from an interface between the silicon carbide member and the first film, and
the first region does not include nitrogen, or a concentration of nitrogen at the interface is higher than a concentration of nitrogen in the first region.
(Configuration 22)
The method according to any one of configurations 10-21, further comprising causing the structure body to be in a temperature lower than the first temperature between the first treatment and the second treatment.
(Configuration 23)
The method according to any one of configurations 10-22, further comprising forming a conductive film on the first film after the second treatment.
According to the embodiment, it is possible to provide a method for manufacturing a semiconductor device whose characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as silicon carbide members, semiconductor regions, first films, conductive films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing semiconductor devices practicable by an appropriate design modification by one skilled in the art based on the semiconductor devices and methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
a C—N concentration of a bond of carbon and nitrogen at a second position in the first direction being a second peak value,
at a third position in the first direction, the C—N concentration being 1/2800 of the second peak value, and
the Si—N concentration at the third position being less than 1/20 of the first peak value.
2. A semiconductor device, comprising:
a silicon carbide member; and
a first film stacked with the silicon carbide member, the first film including silicon and oxygen,
a Si—N concentration of a bond of silicon and nitrogen at a first position in a first direction from the silicon carbide member to the first film being a first peak value,
the first peak value being $1.7\times10^{21}/cm^3$ or more, a C—N concentration of a bond of carbon and nitrogen at a second position in the first direction being a second peak value, a C—N concentration at a third position in the first direction being 1/2800 of the second peak value, and a Si—N concentration at the third position being $1.0 \times 10^{20}/cm^3$ or less.

3. A semiconductor device, comprising:

a silicon carbide member; and a first film stacked with the silicon carbide member, the first film including silicon and oxygen, a Si—N concentration of a bond of silicon and nitrogen at a first position in a first direction from the silicon carbide member to the first film being a first peak value, at a fourth position in the first direction, a concentration of silicon being a minimum value in the first film, and a Si—N concentration at the fourth position being less than 1/20 of the first peak value.

4. A semiconductor device, comprising:

a silicon carbide member; and a first film stacked with the silicon carbide member, the first film including silicon and oxygen, a Si—N concentration of a bond of silicon and nitrogen at a first position in a first direction from the silicon carbide member to the first film being a first peak value, the first peak value being $1.7 \times 10^{21}/cm^3$ or more, at a fourth position in the first direction, a silicon concentration being a minimum value in the first film, and a Si—N concentration at the fourth position being $1.0 \times 10^{20}/cm^3$ or less.

5. A semiconductor device, comprising:

a silicon carbide member; and a first film stacked with the silicon carbide member, the first film including silicon and oxygen, a Si—N concentration of a bond of silicon and nitrogen at a first position in a first direction from the silicon carbide member to the first film being a first peak value, at a fifth position in the first direction, an oxygen concentration being a minimum value in the first film, and a Si—N concentration at the fifth position being less than 1/20 of the first peak value.

6. A semiconductor device, comprising:

a silicon carbide member; and a first film stacked with the silicon carbide member, the first film including silicon and oxygen, a Si—N concentration of a bond of silicon and nitrogen at a first position in a first direction from the silicon carbide member to the first film being a first peak value, the first peak value being $1.7 \times 10^{21}/cm^3$, at a fifth position in the first direction, an oxygen concentration being a minimum value in the first film, and a Si—N concentration at the fifth position being $1.0 \times 10^{20}/cm^3$ or less.

7. A semiconductor device, comprising:

a silicon carbide member; and a first film stacked with the silicon carbide member, the first film including silicon and oxygen, a Si—N concentration of a bond of silicon and nitrogen at a first position in a first direction from the silicon carbide member to the first film being a first peak value, a Si—N concentration at a sixth position in the first direction being less than 1/20 of the first peak value, the sixth position being in the first film, and a distance between the first position and the sixth position in the first direction being 10 nm.

8. A semiconductor device, comprising:

a silicon carbide member; and a first film stacked with the silicon carbide member, the first film including silicon and oxygen, a Si—N concentration of a bond of silicon and nitrogen at a first position in a first direction from the silicon carbide member to the first film being a first peak value, the first peak value is $1.7 \times 10^{21}/cm^3$, a Si—N concentration at a sixth position in the first direction being $1.0 \times 10^{20}/cm^3$ or less, the sixth position being in the first film, and a distance between the first position and the sixth position in the first direction being 10 nm.

9. The device according to claim 1, further comprising a first conductive film, and the first film being provided between the silicon carbide member and the first conductive film.

* * * * *